US008219346B2

(12) United States Patent
Zurbuchen et al.

(10) Patent No.: US 8,219,346 B2
(45) Date of Patent: Jul. 10, 2012

(54) HIGH RESOLUTION TIME MEASUREMENT IN A FPGA

(75) Inventors: Thomas Zurbuchen, Ann Arbor, MI (US); Steven Rogacki, Chelsea, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/162,222

(22) Filed: Jun. 16, 2011

(65) Prior Publication Data

US 2011/0255380 A1 Oct. 20, 2011

Related U.S. Application Data

(62) Division of application No. 12/176,919, filed on Jul. 21, 2008, now Pat. No. 7,979,228.

(60) Provisional application No. 60/951,088, filed on Jul. 20, 2007.

(51) Int. Cl.
*H03K 19/00* (2006.01)
*G06F 11/26* (2006.01)

(52) U.S. Cl. ............... 702/89; 702/79; 702/125; 326/39

(58) Field of Classification Search .................... 702/89, 702/78, 79, 69, 125
See application file for complete search history.

(56) References Cited

U.S. PATENT DOCUMENTS 6,028,993 A * 2/2000 Yu et al. .......................... 703/14
6,219,305 B1 4/2001 Patrie et al.
6,288,587 B1 9/2001 Chen et al.
6,292,021 B1 9/2001 Furtek et al.
6,734,703 B1 * 5/2004 Alfke et al. ..................... 326/38
6,754,613 B2 6/2004 Tabatabaei et al.
7,024,324 B2 * 4/2006 Rifani et al. .................... 702/79
7,062,733 B1 6/2006 Poskatcheev et al.
7,084,393 B2 8/2006 Fuhrer et al.
7,085,668 B2 8/2006 Johnson
7,171,575 B1 1/2007 Plants et al.

OTHER PUBLICATIONS

Andaloussi, et al. "A Novel Time-To-Digital Converter with 150 ps time resolution and 2.5 ns Pulse-Pair resolution," pp. 123-126, 2002.
Fries, et al. "High-Precision TDC in an FPGA using a 192-MHz Quadrature Clock," IEEE, 580-584 (2003).
Kalisz, et al. "Delay-locked loop technique for temperature stabilisation of internal delays of CMOS FPGA devices," Electronics Letters 36(14):1184-1185 (2000).

(Continued)

*Primary Examiner* — Hal Wachsman
(74) *Attorney, Agent, or Firm* — Marshall, Gerstein & Borun LLP

(57) ABSTRACT

Various techniques are described for high resolution time measurement using a programmable device, such as a field programmable gate array (FPGA). The timing may be triggered by any event, depending on the applications of use. Once triggering has occurred, a START pulse begins propagating through the FPGA. The pulse is able to propagate through the FPGA in a staggered manner traversing multiple FPGA columns to maximize the amount of time delay that may be achieved while minimizing the overall array size, and thus minimizing the resource utilization, of the FPGA. The FPGA timing delay is calibrated by measuring for the linear and non-linear differences in delay time of each unit circuit forming the staggered delay line path for the timing circuit. The FPGA is able to achieve nanosecond and sub-nanosecond time resolutions.

27 Claims, 10 Drawing Sheets

OTHER PUBLICATIONS

Kalisz, et al. "Field-Programmable-Gate-Array-Based Time-to-Digital Converter with 200-ps. Resolution," IEEE Transactions on Instrumentation and Measurement, 46(1):51-55 (1997).
Pelka, et al. "Nonlinearity Correction of the Integrated Time-to-Digital Converter with Direct Coding," IEEE Transaction on Instrumentation and Measurement, 46(2):449-453 (1997).
Szplet, et al. "Interpolating Time Counter with 100 ps Resolution on a Single FPGA Device," IEEE Transactions on Instrumentation and Measurement, 49(4):879-883 (2000).
Wu et al. "Firmware-only Implementation of Time-to-Digital Converter (TDC) in Field-Programmable Gate Array (FPGA)," Summary for Submission #1037, IEEE NSS, 2 pages (2003).

* cited by examiner

*FIG. 8B*

Three raw events, one Start, one Stop each

A 1 2 05 1ce5
C 3 1 13 1ce6
C 1 2 0b 1ce7
C 3 1 18 1ce8
A 0 3 08 080f
C 2 2 0e 0810
C 0 3 0d 0811
C 2 2 11 0812
A 0 1 01 733a
C 2 0 08 733b
C 3 3 1c 733b
C 0 1 07 733c
C 2 0 0d 733d
C 3 3 21 733d

802

804

Processed events(14), 20 ns Start to Stop 00014 0d
00013 f0
00014 0b
00013 ff
00013 ff
00013 dd
00013 f9
00014 0f
00013 f0
00014 31
00014 01
00014 0b
00014 17
00013 fd

HIGH RESOLUTION TIME MEASUREMENT IN A FPGA

CROSS-REFERENCE TO RELATED APPLICATION

The present application claims the benefit of U.S. Provisional Application No. 60/951,088, entitled "High Resolution Time Measurement in a FPGA," filed on Jul. 20, 2007, which is hereby incorporated by reference herein in its entirety. This application is a divisional application of U.S. application Ser. No. 12/176,919, Filed on Jul. 21, 2008, now U.S. Pat. No. 7,979,228, the entire specification of which is hereby incorporated herein by reference.

STATEMENT REGARDING FEDERALLY SPONSORED RESEARCH OR DEVELOPMENT

This invention was made with government support under Award Number NNG04GP15G with Contract F01141 awarded by the National Aeronautics and Space Administration. The government has certain rights in the invention.

BACKGROUND OF THE DISCLOSURE

1. Field of the Disclosure

The disclosure relates generally to techniques for measuring pulse timing based events and, more particularly, to techniques for resolving pulse times measurements at small scale times.

2. Brief Description of Related Technology

It is challenging to directly measure of the mass and velocities of atoms, molecules and larger-scale microscopic particles. Time of flight (TOF) techniques can identify particles (or other triggering events) by measuring the time it takes a particle to travel a particular distance. These techniques can be used to measure properties like mass and velocity that are correlated to travel time. Intuitively this makes sense, because particles of lower mass with a given energy will typically traverse the same flight path in a shorter period of time than particles of higher mass. TOF techniques, for example, are used in mass spectroscopy to measure the velocity of a particle as it moves through a known distance, and then correlating that velocity to a mass from which the particle may be identified.

Because TOF techniques are effective in measuring characteristic properties of particles, the techniques are useful in atmospheric and space applications where particle detection can be performed under diverse, often very challenging conditions. TOF mass spectrometers have been used in space application as part of a plasma imaging spectrometer that measures particle count rates, energy distributions, velocity vector distributions, and mass spectra, and do so at high time resolutions and with relatively low electron volt energies.

TOF techniques are used in other chemical and biological applications in combination with other techniques, such as gas-chromatography and fast kinetic processes measurements such as ion movement. More generally, TOF techniques fit within a category of techniques that use time measurements between triggering events (START and STOP events) to analyze some phenomena. Highly accurate timing measurements, for example, are used in circuit design to test the propagation of signals through digital and analog circuits as part of automatic circuit testing equipment.

While highly accurate timing techniques for TOF and other applications are known, those techniques typically require substantial computing power, or, are performed in application specific circuits. In fact, timing circuits generally are developed using an integrated circuit with phase-lock loops, delay-locked loops, and serial/deserializers. TOF applications are typically implemented through an application specific integrated circuit (ASICs) or a microprocessor. These options are costly and can require substantial development time, especially for applications where the time scales become very small, for example, on the order of a 100 picoseconds or less. Furthermore, such circuits have a substantial environmental imprint, and thus are particularly disadvantageous in spacecraft applications where space and available power are at a premium. The circuits are designed for one specific application and it is rather difficult to apply them from one application to the next, without going through the same process. Finally, it is rather difficult to package integrated circuits in radiation protected configurations, as would be required for proper operation in space applications. In fact, because of the limitations on TOF circuits, only a few TOF circuits (and very expensive ones) have been rated "space qualified."

Thus, there is a need for lower cost, efficient timing circuits having time scales short enough to allow for useful time of flight applications, in space and other applications.

SUMMARY OF THE DISCLOSURE

The present application describes various techniques for measuring the time between start and stop pulses. These pulses may be created by any triggering event, such as a particle hitting a sensor target, an electrical signal triggering a logic gate, a particle entering a mass spectrometer. Regardless of the triggering event, provided are techniques for performing highly accurate timing measurements, in the nanosecond to sub-nanosecond range, using field programmable gate arrays (FPGA). Generally speaking, by using a FPGA, these nanosecond scale timing circuits may be implemented without highly application-specific and costly circuit design. Moreover, because the FPGA is a programmable device, the timing circuits may be programmed in the field by the customer without requiring extensive pre-deployment design time. The techniques also are self calibrating. The timing data collected between triggering events is compared to a look-up table of timing data and from this comparison the timing data may be calibrated against linear variability in the FPGA timing circuitry.

The ability to do sub-nanosecond time measurements in a calibrated manner on a FPGA is particularly useful in outer space applications, because numerous available FPGAs have been rated as "space qualified."

In accordance with one aspect of the disclosure, an apparatus comprises a field programmable gate array having at least one delay line to propagate an electrical signal, the delay line having a plurality of unit circuits; a memory buffer coupled to store snapshot data from the at least one delay line; and a processor adapted to analyze data from the memory buffer to determine calibration data for the at least one delay line, the calibration data representing a measured delay for each of the unit circuits in the least one delay line.

In some examples, the delay lines are collectively characterized by a delay time that is longer than an operating clock cycle for the field programmable gate array. The operating clock cycle may be 100 MHz or faster to achieve nanosecond or sub-nanosecond resolution. In some examples, the pulse propagation time of each delay line is less than the operating clock cycle, and in some examples the memory buffer circuit comprises at least one latch and first in first out (FIFO) data buffer.

In some other examples, the at least one delay line comprise a plurality of delay registers, and wherein the processor is adapted to determine a state of each of the plurality of delay registers to determine the calibration data. In some such examples, the plurality of delay registers are a plurality of flip flops.

In accordance with another aspect of the disclosure, a method of timing pulse events comprises: sending a start event to a field programmable gate array to start progression of an electrical signal through a delay line in the field programmable gate array, the delay line comprising a plurality of unit circuits; determining a time delay of each of the plurality of unit circuits in the delay line; sampling the delay line to develop snapshot data of the progression of the electrical signal; analyzing the snapshot data to identify edge transitions in the snapshot data; analyzing the edge transitions to determine a timing difference between the start event and at least one stop event; and calibrating the timing difference between the start event and the at least one stop event based on the time delay of each of the plurality of unit circuits.

While the term column is used herein in reference to the FPGA, it will be understood that the FPGA could be set up such that electrical signals propagate across the FPGA, in what might otherwise be termed a row. As used herein the term column, therefore also encompasses row-based propagation through an FPGA. Furthermore, it will be apparent from the teachings herein that a delay line path through an FPGA may take on other paths such as including combinations of propagations up and across an FPGA array. The delay lines are staggered in that the electrical pulses need not move in a linear line through the array of the FPGA. But the exact pattern of that staggering may be varied and the benefits of a highly accurate, high resolution timing circuitry still may be achieved.

In some examples, the staggered column delay line comprises a plurality of unit circuit columns in the field programmable gate array, wherein at least one unit circuit in a column is electrically coupled to a unit circuit in another column. In some examples, the method further comprises calibrating the staggered column delay line by measuring delay times between predetermined start and stop pulses propagating in the staggered column delay line. Timing difference (i.e., timing resolution) between first pulse and second pulses may be below 10 ns and even below 1 ns in some examples.

In other examples, an apparatus for measuring time between a start event and at least one stop event, the apparatus comprising a field programmable gate array assembly having a plurality of configurable logic blocks to propagate an electrical signal in response to the start event, wherein the field programmable gate array assembly is configured to capture snapshot data from the plurality of configurable logic blocks every clock cycle event to identify progression of the electrical signal through the plurality of configurable logic blocks until at one of the at least one stop events is detected.

In some such examples, the field programmable gate array assembly is configured to capture snapshot data every clock cycle event to identify progression of the electrical signal until each of a plurality of the stop events is detected. In some of these examples, the plurality of configurable logic blocks are configured into a plurality of columns each formed of a plurality of rows of configurable logic blocks, such that the field programmable gate array assembly is configured to capture snapshot data for every one of the plurality of columns each clock cycle event.

In other such examples, the apparatus further comprises a processor to analyze data from the electrical signal edge detector to determine the time between the start event and the at least one stop event. Where, in some of these examples, the processor is to calibrate the data from the electrical signal edge detector based on measured delay times for the plurality of configurable logic blocks. The processor may compensate for delay time drift in the plurality of configurable logic blocks. The processor may compensate for temperature drift of the plurality of configurable logic blocks.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 1:
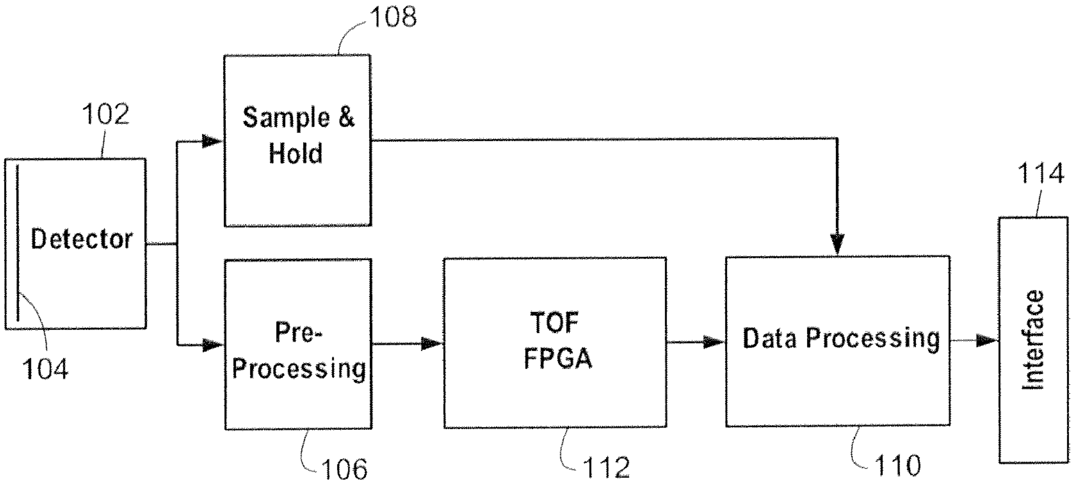
FIG. 1 illustrates an example device that may use an FPGA timing circuit in a TOF application.
Figure 4:
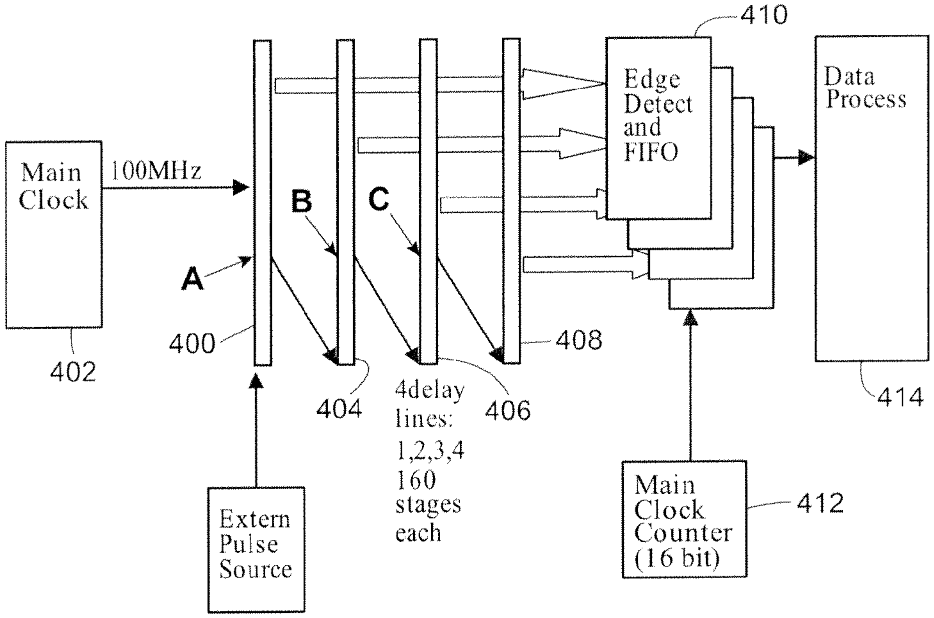
Figure 5:
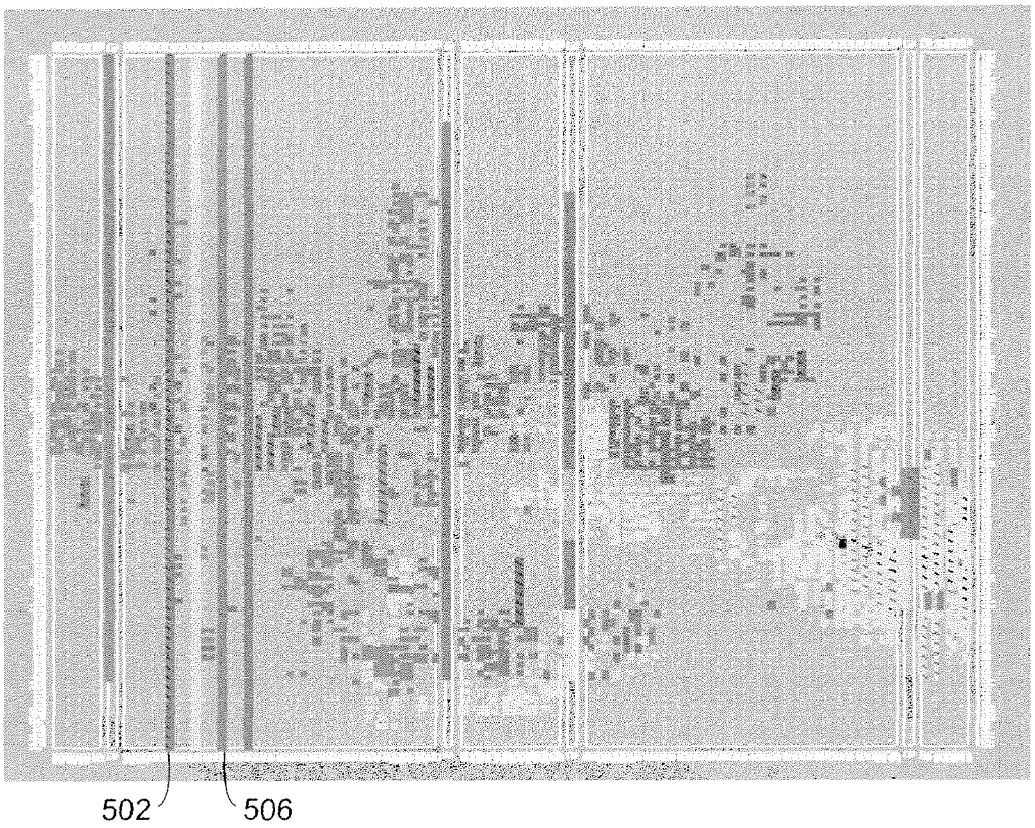
Figure 6:
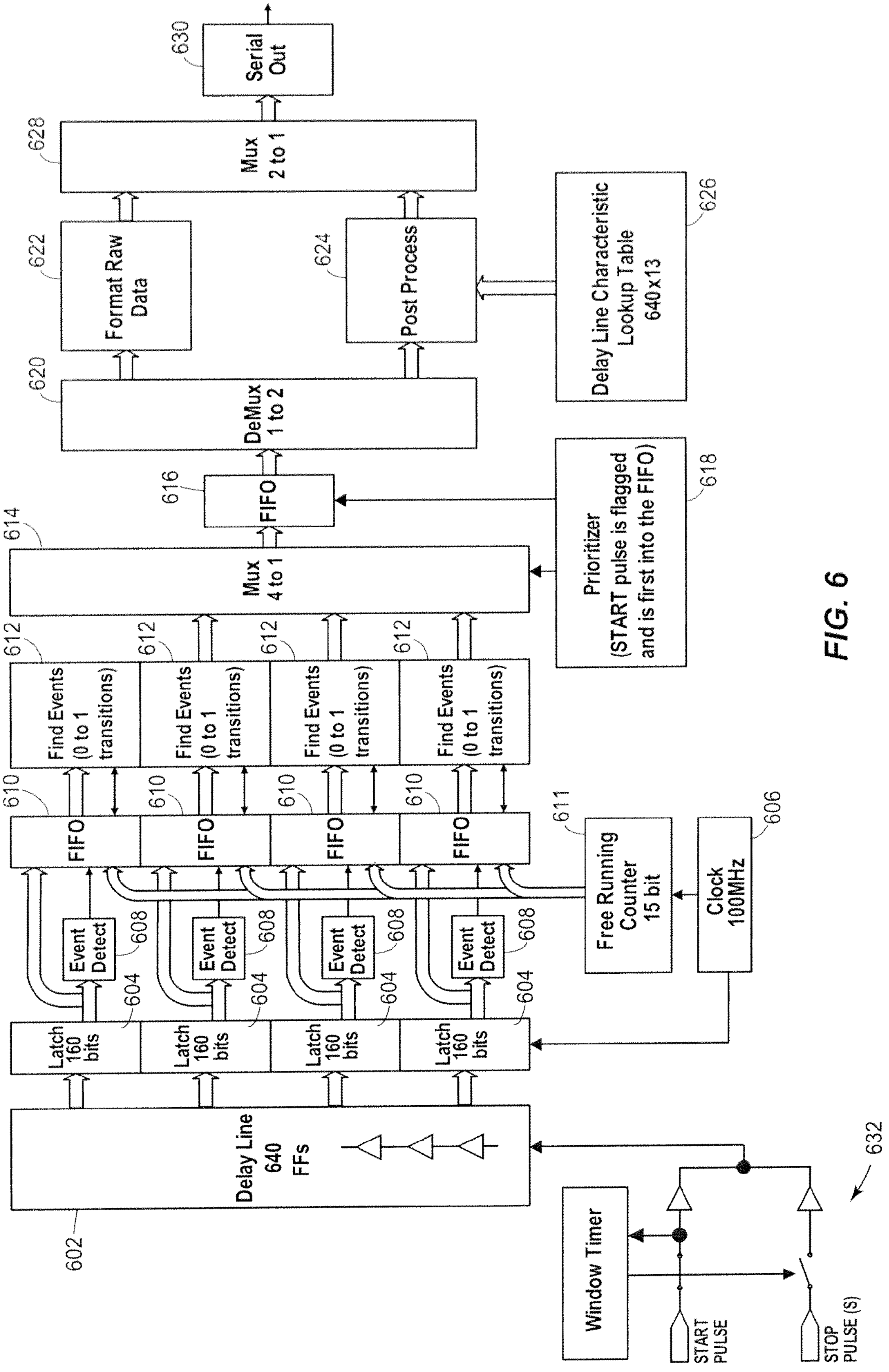
Figure 7A:
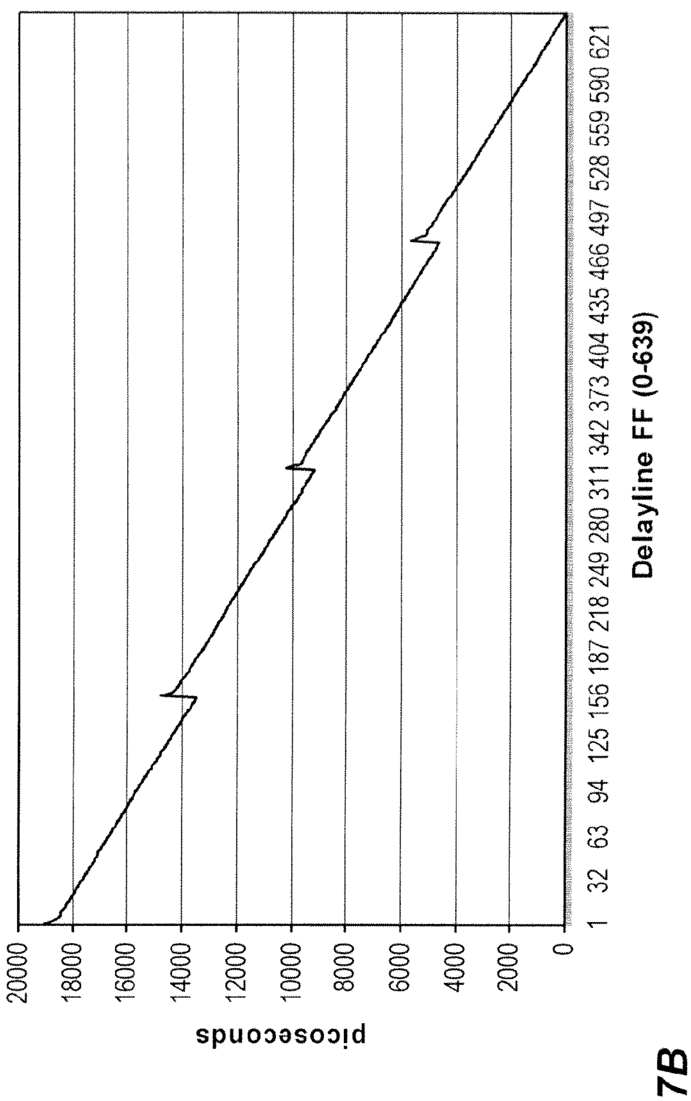
Figure 7B:
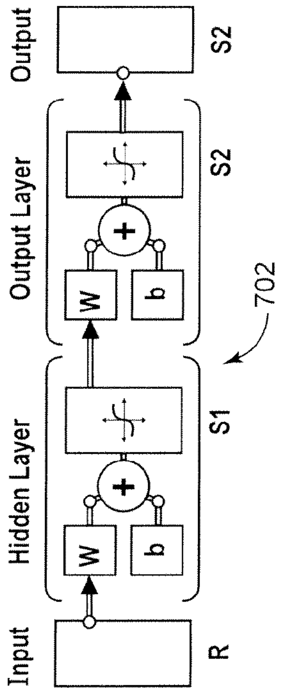
Figure 8A:
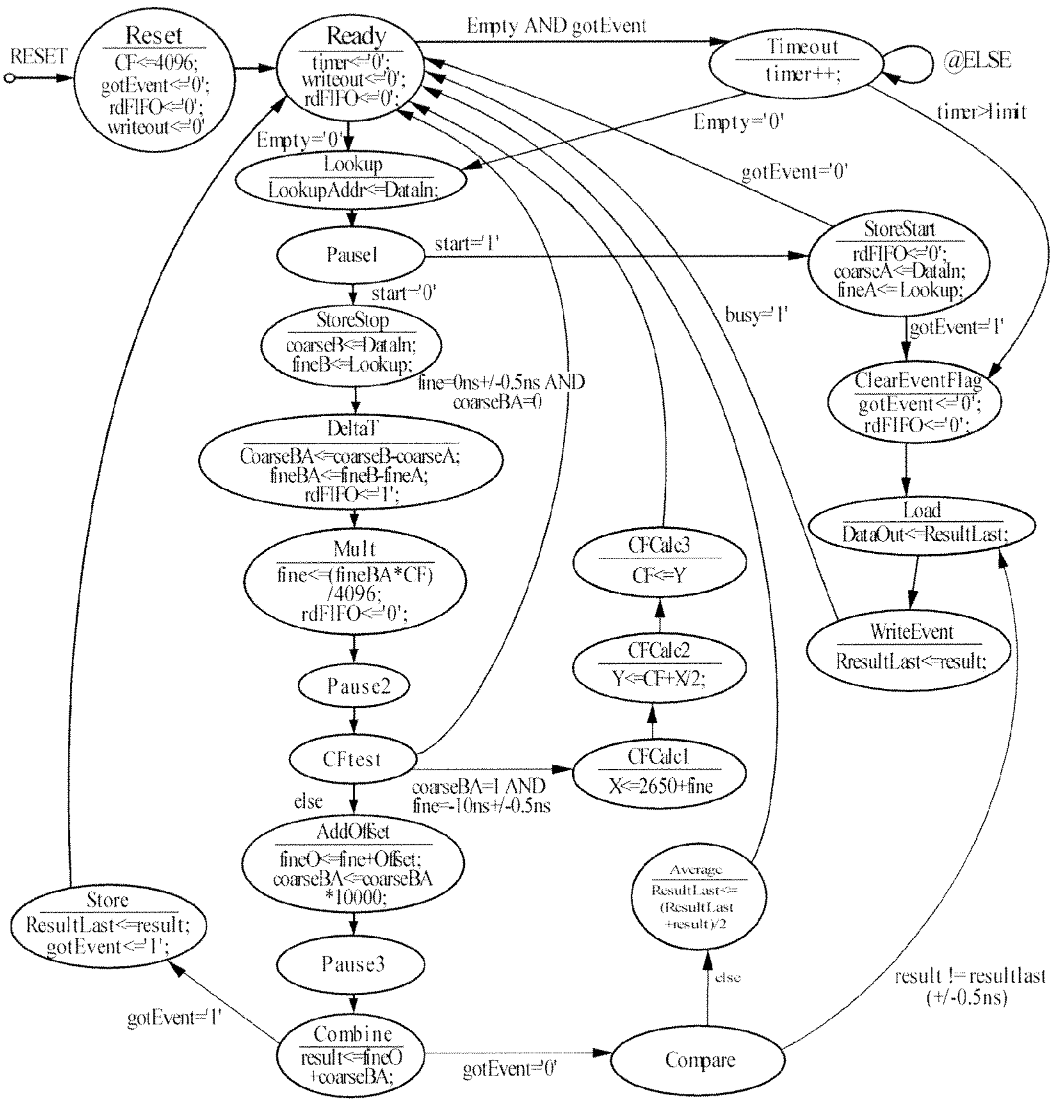
Figure 9A:
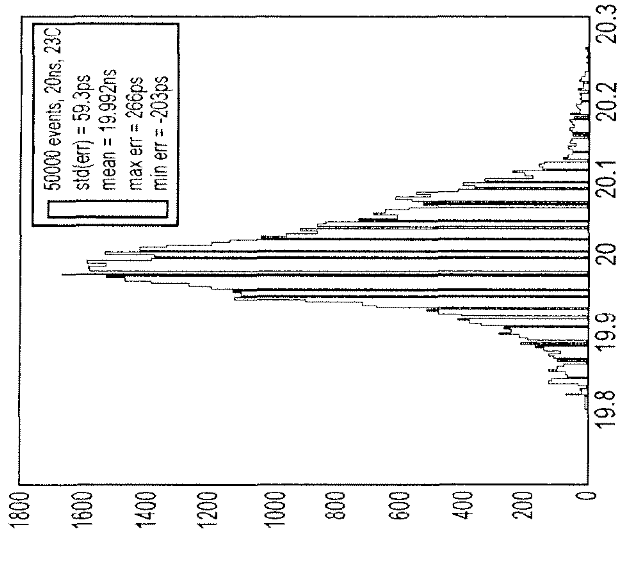
Figure 9B:
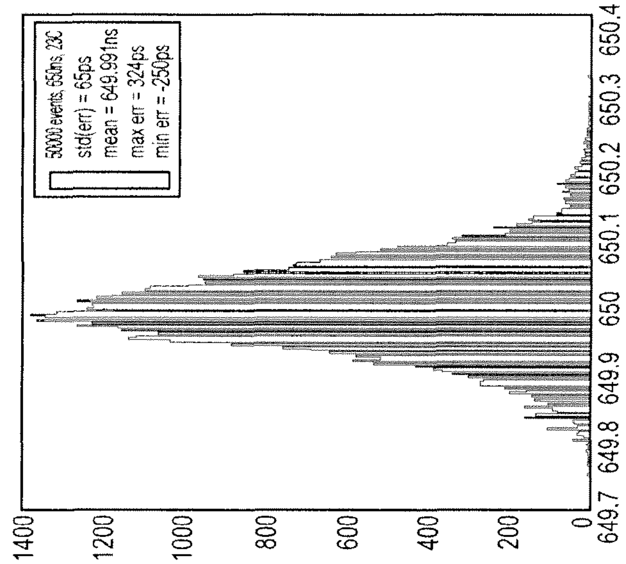
Figure 9C:
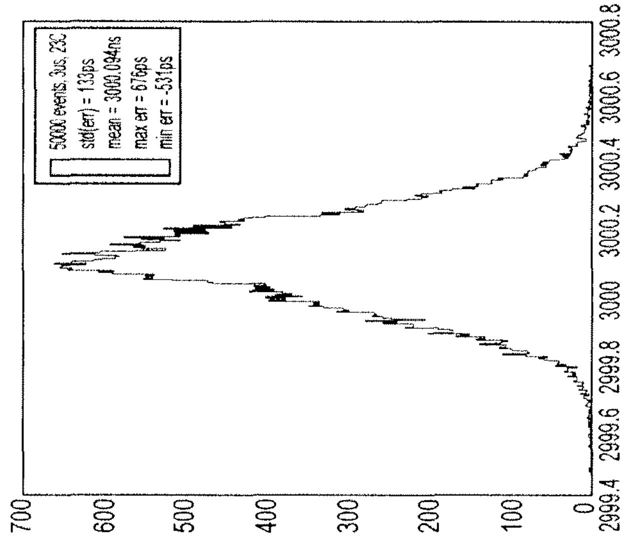

FIG. 4 also illustrates staggered propagation of a pulse across columns of the FPGA of FIG. 1;

FIG. 5 is a graphical illustration of unit circuit usage and pulse propagation in a FPGA;

FIG. 6 is a block diagram of an example implementation of sub-nanosecond timing circuit achieved using an FPGA;

FIG. 7A illustrates a lookup table, and FIG. 7B illustrates a neural network, where the lookup table is constructed using a neural network and raw data from the FPGA of FIG. 6;

FIG. 8A illustrates a state diagram showing an example post processing algorithm, and FIG. 8B illustrates two resulting data output tables;

FIGS. 9A-9C illustrate performance plots for a timing circuit in accordance with examples described herein; and FIGS. 10A-10F illustrate performance plots for a timing circuit in accordance with examples described herein.

While the disclosed methods and apparatus may be used in embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

Various techniques are described for high resolution time measurement using a programmable controller, such as an FPGA. The timing may be triggered by any event, depending on the applications of use. But once triggering has occurred, a START pulse begins propagating through the FPGA. Ordinarily, propagation would be along columns of the array of circuit elements in the FPGA. Yet some of the present techniques stagger pulse propagation across different columns of the FPGA, to maximize the amount of time delay that may be achieved while minimizing the overall array size (and thus minimizing the environmental imprint) of the FPGA.

The FPGA design has the capability of using a single START pulse to trigger timing measurement and multiple STOP pulses to allow the time difference to be determined between many different events, without resetting timing operation. The FPGA takes snapshots of its entire staggered delay line propagation each clock cycle and from this edge transitions are determined and timing between START and STOP pulses are determined. By using a technique that may be used on small array sized FPGAs operating at relatively fast clock rates (e.g., 100 MHz), high resolution time measurements between start and stop event can be performed in the nanosecond and sub-nanosecond range. For example, systems may be designed for TOF applications that require accuracies of 0.5 ns or better (from delay lines between 10 and 20 ns total) with adjustability up to at least 1500 ns, for peak measurement rates of 100,000 events/second and higher.

While various examples are discussed using a staggered delay line configuration in an FPGA, the techniques herein may be used on a single delay line as well. For example, not only may staggered delay lines having a total delay time of between 1 and 2 clock cycles be used, but a single delay line having a total delay time of between 1 and 2 clock cycles may be used as well.

FIG. 1 illustrates an example TOF apparatus 100 that may be used to trigger time of flight measurements of a triggering event. A detector 102 detects a triggering event, such as a particle impending on a sensor pad or array 104, and in response produces triggering signals. A pre-processor circuit 106 processes these triggering signals by performing operations such as analog to digital conversion, signal amplification, and noise shaping to produce a normalized output signal representative of the detected signal of the stage 102. In the illustrated example, the signal from the stage 102 is also coupled into a sample and hold circuit 108 that collects signal data at periodic intervals for analysis in a processor 110. The sample and hold circuit 108, for example, may accumulate detector signals over time for magnitude measures in the data processor 110.

A time of flight (TOF) block 112 is coupled to the pre-processing block 106 and measures the time between events triggered in the detector 102. In the illustrated example, the block 112 is implemented in a FPGA, which can be any number of FPGAs due to the programmable nature of these devices. Example FPGAs include the VIRTEX-II family of FPGAs (e.g., XC2V1000, XC2V3000, and XC2V6000) sold by XILINX of San Jose, Calif., as well the other VIRTEX® family of FPGAs (e.g., the VIRTEX-4 and VIRTEX-5 families). The TOF block 112 may be implemented using the FPGA's available from Actel Corporation of Mountain View, Calif., for example one of the antifuse FPGA devices like the AXCELERATOR®. SX-A, eX, and MX devices. These FPGAs are commercially available programmable and reprogrammable devices and equivalent radiation-tolerant, space-qualified devices are available. Other programmable and reprogrammable logic devices may be used instead, whether radiation-tolerant and space-qualified or not.

The output from the data processor 110 is provided to external computer or storage through an interface 114.

Figure 2A:
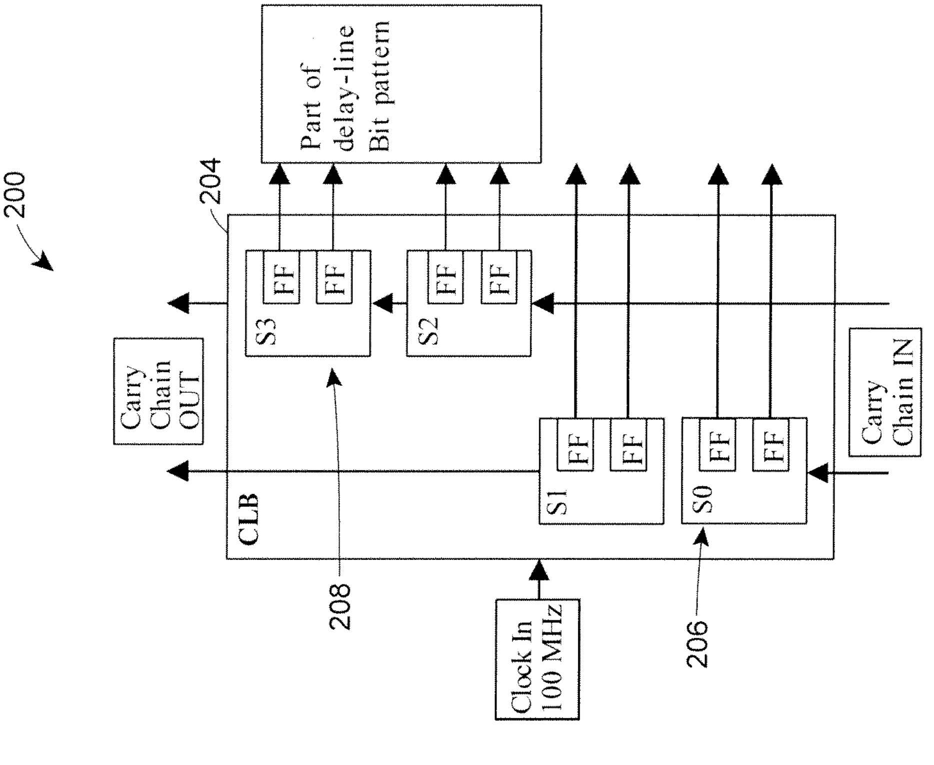
FIGS. 2A and 2B illustrate a sample architecture of a FPGA, with FIG. 2A illustrating a block diagram of a configurable logic block that functions as the unit circuit in the FPGA of FIG. 2B.
Figure 2B:
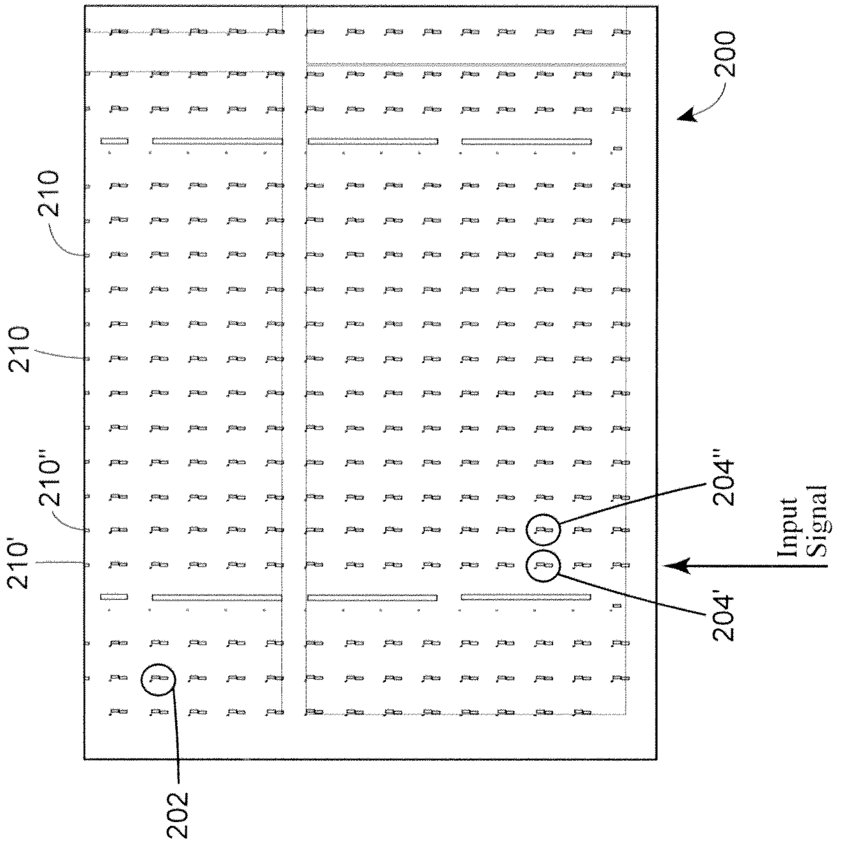

FIGS. 2A and 2B illustrate an example FPGA 200 that may be configured to form the TOF circuit 112 of FIG. 1. The FPGA 200 includes a plurality of identical unit circuits 202 (only a few of which are numbered for convenience sake) that operate as configurable logic blocks 204 (CLBs) as also shown. The picture in FIG. 2B is a screen shot taken from a XILINX ISA software tool operating in a WINDOWS operating system environment. The circuit units 202 may be programmed using known techniques and to form functional circuit elements as discussed below. In general, each unit circuit 202 comprises a CLB 204, which is constructed of two segments. Each unit circuit 202 receives a clock signal, in this case a 100 MHz clock signal and uses that clock signal to drive data storage in its two segments 206, 208, each comprising a flip flop-based shift register or slice. Segment 206 includes slices S0 and S1, and segment 208 includes slices S2 and S3, as shown.

The FPGA 200 is configured for input signals entering the bottom of the FPGA 200 to propagate along vertical columns 210 of the FPGA 200 (or some of which are numbered). The CLB 204 receives an input signal (carry chain IN) for the respective row either from a preceding CLB or direct column entry. The CLB 204 propagates that signal via a known delay through the segments 206, 208 to the next circuit unit, i.e., CLB 204 (not shown), in the column. The output from segment 206 is coupled to a block memory of the FPGA for pattern analysis. The output of segment 208 is coupled horizontally in the FPGA 200 to a second column, adjacent the column of the original CLB 204. For example, the second segment of the CLB 204' in column 210' couples its delay line signal to a CLB 204" in column 210", for continued vertical propagation of the pulse activated signal. This coupling demonstrates a staggered vertical propagation of a pulse signal.

By propagating a pulse signal, not only vertically but horizontally across an FPGA, the total pulse signal delay time, or collective delay time across all or a portion of the CLBs 204) may be extended to match more closely with the operating speed of the FPGA. For example, a pulse trigger is incident upon the bottom of the columns of the FPGA 200. Each column 210 will have a propagation time depending in part on the number of rows in the FPGA. For small enough FPGAs, that column propagation time may be only the order of nanoseconds, for example, approximately 6 ns. But while short propagation times are desirable for high resolution timing circuits, a signal in each column 210 would traverse an entire column of the FPGA 200 and thus 'escape' without detection before a single clock cycle has passed, depending on the speed of the FPGA clock. For example, for an FPGA operating at 100 MHz, i.e., 10 ns clock times, a 6 ns column delay time is too fast to ensure proper transition measurements. Therefore, to introduce delays that will allow at least one pulse sampling within a clock cycle, each or certain CLBs 204 may be coupled to transfer a signal to an adjacent column for continued vertical propagation of the pulse. By transferring the signal to adjacent columns, additional delay is introduced on the propagating signal, as the signal is forced to traverse larger numbers of CLBs before exiting the FPGA 200.

Each of the slices in each segment 206, 208 has two flip flops, leaving four slices and eight flip flops per CLB 204 in the illustrated example. With an FPGA 200 of 40 rows, there would be 160 flip flops in a full column of slices. Delay lines use a carry chain network that runs up the column vertically. With an average propagation time between flip flops of about 35 ps, it can be calculated that the delay time per column is approximately 5.6 ns. Thus, one column propagation would not be enough with an FPGA driven by a 100 MHz (or 10 ns) clock. Multiple columns would be more useful.

Figure 3:
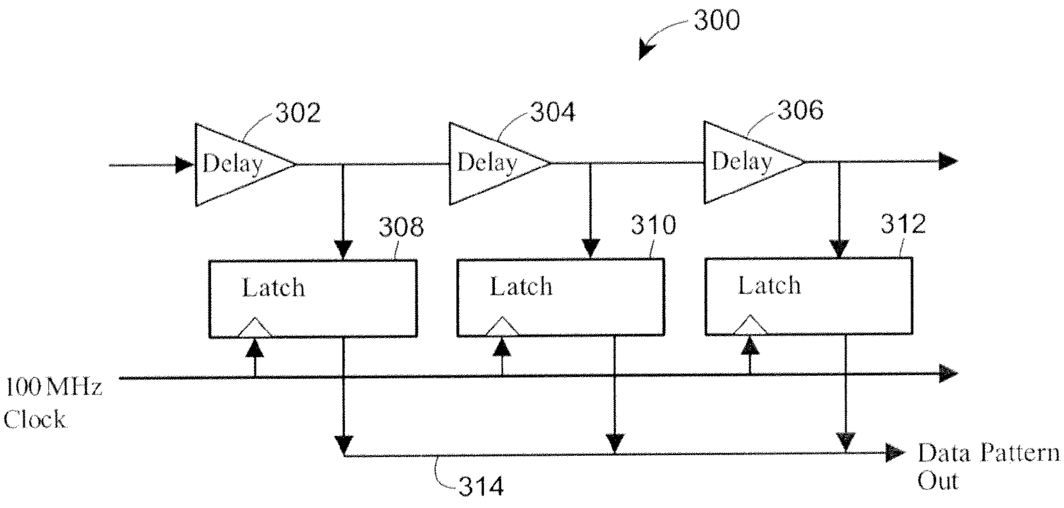
FIG. 3 illustrates a delay line architecture that models the staggered propagation of a pulse across columns of the FPGA of FIG. 1.

FIG. 3 illustrates a circuit diagram 300 of delay line propagation of a pulse signal. An input signal propagates along a chain of flip flops. A snapshot of the FPGA array is taken every clock cycle, e.g., every 10 ns, producing a delay line data pattern for the FPGA. Four columns of the FPGA may be used to achieve a total delay time that is above the clock cycle (10 ns), in particular approximately 20 ns total delay time, thereby allowing for pulse snapshots during the entire clock cycle. The vertical columns are tapped at a point where the signal reaches the start of the next delay line column before running off the end of the first column. Delay lines are built using area constraints, fixing the carry chains to specified columns.

In FIG. 3, CLBs are reflected as delay segments 302, 304, and 306 respectively. Snapshot data from the delays segments 302-306 are captured every clock cycle and stored in respective latches 308, 310, and 312. The 100 MHz clock signal controls operation of these latches 308-312, dumping latch data as a delay line bit pattern (or data pattern) to line 314 every clock cycle.

FIG. 4 illustrates another example, in which an external pulse source is coupled to a first FPGA column 400, controlled by a clock signal from a main clock 402. As the coupled pulse propagates up the delay line of column 400, after a fixed delay amount, a pulse signal (e.g., a portion thereof) is coupled as an input to a second delay line column 404. The coupling occurs at a point A associated with the fixed delay. The pulse signal in the first column 400 continues to propagate up until the end of the delay line column 400 is reached at which point the signal in column 400 dissipates. The point A is positioned such that the signal portion continuing up column 400 does not reach the end of that column prior to the signal portion to be coupled to column 404 reaching the bottom of that column for propagation upward. That is, it is desired to have no down time in which a signal is not propagating in at least one of the two adjacent columns 400 and 404. The same is true for the other coupled staggered adjacent columns. The signal in column 404 similarly continues to propagate vertically up the delay line, until a point B is reached, at which time, a portion of the pulse signal is coupled to a column 406 as an input signal. Similar propagation and delay line coupling occurs in column 406, where at a point C coupling occurs to a final delay line 408. Assuming a 40 row FPGA, each of the four delay line columns 400, 404, 406, and 408 would have 160 flip flop stages or snapshot points, as each CLB has four flip flops, thus leading to a maximum of 640 flip flops in a delay line of the FPGA. While four delay lines are shown, it will be appreciated that more or fewer delay lines may be used, e.g., 3 delay lines and alternate flip flops for a total of 240 flip flops in the total chain.

FIG. 5 illustrates a floorplan view 500 for a FPGA showing which CLBs in the various rows are active over a period of operation. There are four delay line columns 502, 504, 506 and 508 in the map 500 which reflect the propagation of an external pulse source signal across a staggered (multi-column) delay line in accordance with the present application. The coded rectangles represent logic elements assigned to implement the design. Other vertical columns show specialized logic resources on the chip, such as block memory elements. The image was captured from screen views produced by a XILINX software design tool, such as the ISE Design Suite of software available from XILINX (including ISE WEBPACK™, ISE SIMULATOR, and ISE FOUNDATION™).

As further illustrated in FIG. 4, each column 400, 404, 406 and 408 is coupled to an edge detection and FIFO circuit 410 that collects delay line patterns, snapshots, every clock cycle under control of a main clock counter 412. The snapshot data is offloaded to a data processor 414 for determining pulse propagation times and calibration data for flip flops which may have different delay times, including non-linear delay responses.

FIG. 6 illustrates a block diagram 600 of an example implementation of sub-nanosecond timing circuit achieved using an FPGA. A delay line block 602 represents the staggered column based pulse signal delay propagation as may be achieved across different columns of an FPGA as discussed above. In the illustrated example a 40 row FPGA is assumed, having 4 flip flops per CLB, and thus 160 flip flops per delay line and thus 640 flip flops across four delay lines. Tap points A, B, and C in FIG. 4 are not at the top of the columns, but are tap points partway up the delay line. FIG. 6 illustrates the latching over the entire delay line, but does not show the fact that the 4 delay lines are also tapped separately at the points A, B, and C, and that there is overlap in time between the delay line columns as a result. The state of each of the delay line flip flops are latched every clock cycle into one of a bank of latching circuits 604, which in the illustrated example are 160 bit latch circuits capable of latching the states of all flip flops in a delay line column. A clock 606 triggers latching such that every clock signal, a snapshot of the entire delay line (and all delay lines) is taken. The output of each latch 604 is coupled to a respective event detection circuit 608 that determines whether an edge transition has occurred somewhere along the latched output from the flip flops. That is, the circuit 608 determines if a transition has occurred over the output states of the flip flops making up the delay line. If an edge has been detected, then the latched data is buffered to a respective first in first out (FIFO) buffer, which buffers the latched data for serializing into a respective event transition circuit 612. The circuit 612 analyzes the serialized data from the respective FIFO 610 to identify logic 0 to logic 1 transitions; that is, the circuit 612 in the illustrated example identifies rising edge transitions in the snapshot data from latches 604. A free running counter 611 gives a coarse time adjustment for the FIFOs 610.

The latch 604 and FIFO 610 pairs form a memory buffer portion of the circuit 600 and may be separate from the FPGA architecture or embedded therein, for example through an FPGA with embedded random access memory (RAM) and/or FIFO blocks.

While the illustrated example is discussed in terms of finding rising edge transitions it will be appreciated that the configuration 600 could be modified to identify falling edge transitions within latch data or falling edge and rising edge transitions within latch data. Alternatively, in other examples, the circuits 612 may identify the center points of a logic low pulse or a logic high pulse in the latch data, as in some instances it may be more advantage to identify maximum and minimum values in the propagating pulse signal and use that sampling point for data processing instead of using edge transitions as data identifiers.

The output from the event transition circuits 612 are coupled to a 4-to-1 multiplexer 614 which serializes the data from each and combines them into a FIFO 616. A prioritizer circuit 618 analyzes the data from the circuits 612 and controls the multiplexer 614 to serialize those outputs such that the first data into the FIFO 616 is that of the start pulse, i.e., the initiating pulse coupled to the delay line 602. The sample data for the stop pulses would follow into the FIFO 616.

The data from the FIFO 616 is coupled to a 1-to-2 demultiplexer 620 which couples the serial data along two different paths. In a first path, raw data is formatted in a block 622. This raw data is used to characterize the delays through the delay line 602 so that the system 600 can self calibrate by measuring, and then subsequently compensating for, fluctuations in delay line differences across the staggered CLBs (and flip flops) of the FPGA. The block 622 may be used for calibrating the system 600 by collecting raw data from a known test pulse being applied to the FPGA and off-loading that raw data to an external processor for developing a lookup table indicating the delay times for each unit circuit in a delay path, including any non-linearities between unit circuits. In a second path, the raw data from the demultiplexer 620 is coupled to a post processing block 624 that compares the data to a previously constructed lookup table 626 (e.g., constructed using the block 622) and produces calibrated time values between the start pulse and one or more stop pulses coupled to the delay line 602.

With the present techniques, there may be N stop pulses for every 1 start pulse, allowing for multiple timing measurements. The time measurements may be relative time differences made between pulses. Or the time measurements may be absolute time differences where the pulses (START and STOP) are timed against a coarse clock. This would allow the FPGA pulse data to be synchronized with timing measurements in other devices all synchronized with a master coarse clock. A START and STOP pulse generator 632 is shown by way of example, where the generator 632 may represent dedicated pulse generator circuit, the output of a photo-responsive sensor, etc.

It is well known that propagation rates of signals in FPGAs are affected by the power supply voltage and temperature. The variation in measured pulse delay times would be unacceptably large without a means to compensate the delay line propagation rate against a known standard. One technique used by instrumentation is to periodically enter a special calibration mode where known signals are introduced, analyzed, segregated from actual data, and used to produce a measurement correction factor. The disadvantage of this approach is that data collection is periodically halted to allow calibration to proceed. Block 624 incorporates an algorithm that utilizes the data pulses themselves to continuously compensate the delay line propagation rate, i.e., compensating for changes across the delay line such as temperature changes that introduce delay across all staggered columns of the FPGA. The block 624 thus not only calibrates the raw data by comparison to the lookup table, the block 624 may also during runtime compensate for delay time drift in the FPGA that may occur during different operating conditions. The block 624 for example may track the propagation of the edges of a known pulse to determine if the FPGA is experiencing some sort of delay time drift. The measurement standard is the 100 MHz clock, and the delay line separation between the same pulse edge captured 10 ns apart provides the necessary calibration information. No calibration mode is needed and data collection can continue uninterrupted.

The data rates from the blocks 622 and 624 will be related to the data rate of the pulses into the delay line 602. However, the data rates of the entire system may also be limited by the depth of the FIFO, therefore in some configurations larger FIFOs may be used for larger bandwidth applications. In general, however, 16 or 32 entry FIFOs have been used and provide ample headroom for meeting the 100,000 events/second sample rates.

The data from blocks 622 and 624 are combined in multiplexer 628 and sent to a serial output port 630 for further data processing, storage, etc.

Thus FIG. 6 shows an example system having a field programmable gate array with a plurality of delay lines capable of collectively propagating an electrical signal, and a memory buffer coupled to store snapshot data from those delay lines and from which a processor can calibrate the snapshot data to determine the timing between events such as between a start event and one or more stop events or between the stop events. This calibration, as discussed herein, may accurately compensate for generally any drift in the delay times of the unit circuits or CLBs form the delay lines and in particular from temperature effects that create drift in FPGA performance. The snapshots can be taken ever clock cycle-based event, which could mean every clock cycle period, or half period, or every two or more clock cycles. The FPGA may be programmed to achieve the desired timing resolution.

To calibrate the system, the raw data from the block 622 is used to create a lookup table of progressive delays across the flip flops along a staggered (i.e., multicolumn) delay line. FIG. 7A illustrates a lookup table 700 constructed using a neural network 702 (shown in FIG. 7B) in MATLAB (shown) operating on raw data from the block 622. The lookup table 700 is from a snapshot of a Mentor Graphics Neural Net toolkit available from Mentor Graphics of Wilsonville, Oreg., and for use in MATLAB. Although the neural network 702 (or other implementation) may be achieved through the FPGA, in the preferred example the neural network 702 is external to the FPGA to determine delay-line non-linearities. The neural network 702 is trained with this raw data and used to construct the contents of the lookup table 700. The neural network may receive typically 2 or more input parameters at an input stage R, from which multiple (e.g. 80) hidden layers in a hidden layer stage S2. The output of each hidden layer S1 is coupled to an output layer S2 of flip flop delay time data used to construct the lookup table 700 at output stage, S3. All the layers, hidden and output, have weighting and bias factors which are adjusted during a training phase. Known pulse timing was used to produce training data. Once trained, the lookup table could be constructed by applying a sequence of all the Flip flops to the neural net. The neural network 702 is illustrated for example purposes. Persons skilled in the art will appreciate that there are numerous ways to construct the delay-line lookup table and that using MATLAB is just a practical and convenient way to do this. Other mathematical methods could have been used to achieve the same result, i.e., to characterize the delay-line as accurately as possible, because it is advantageous not to simply assume that all the FF delays are equal and that the delay-line is a linear sequence. By accounting for delay-line non-linearities a better, more accurate result may be achieved.

To construct this calibration, known START and STOP pulse pairs are introduced into the system and the raw data from these is used to construct the lookup table 700. Although the lookup table 700 looks relatively linear across flip flop response times, in fact, there may be numerous non-linear flip flops whose delay times are modeled in the lookup table. To construct the table, multiple files of raw data may be collected from known START and STOP times, with many events per file, to train and test the accuracy of the neural network 700. Once the neural network has been trained, a sequence of all possible STOP event positions is presented to the network, creating the lookup table 700. As is shown the lookup table 700 shows spikes at the locations in which pulse are staggered over from one column to the next. The total delay time across all 640 flip flops is approximately 20 ns, or approximately 2 clock cycles under a 100 MHz drive signal. Once the lookup table has been created, data processing circuitry can use the lookup table to determine the timing between two triggering events.

As part of the calibration the system may compare earlier captured edge transition data (rising or falling edges) to later captures for the same edge transition, i.e., from the same known START/STOP pulse pair, to determine if the FPGA's performance is changing over time. Thus the lookup table of the FPGA timing delay performance may be monitored over time to ensure that the performance is consistent or where not, recalibrated for accurate timing delay measurements.

FIG. 8A illustrates a state diagram showing an example algorithm that may be executed by the post processing block 624. Raw event data is converted into measured time values. The input data indicates event location in the delay line. The first START event is flagged and is the first event out of the FIFO, as discussed above. The output data is in nanoseconds and may be in a xxxxx.xx hexadecimal format. The (previously generated) lookup table is accessed for determining the characteristics of the delay line. Multiple captures of START events may be used to automatically adjust a calibration factor for the system. Multiple captures of STOP events may also be combined to reduce system error, and in this system zero or more STOP pulses maybe associated with each START pulse. FIG. 8B also shows tabular data with three raw events, one START, and one STOP each, and the resulting processed events (14), 20 ns START to STOP. FIG. 8*b* shows two data output tables, table 802 on the lower left of FIG. 8B and table 804 on the lower right. The "A" value in the table 802 indicates that a START pulse has occurred, after which time the next 3 "C" pulses would all be subsequent edges of either the same START pulse or a subsequent STOP pulse. The far right column ("1ce5") of table 802 indicates the count on the 10 ns captures that have occurred. The first two rows indicate a timing count difference of one 10 ns time difference (1ce5 to 1ce6), which would amount to the same pulse propagating in the same delay line. The block 624 analyzes the amount of movement the same pulse will experience over a 10 ns window and use that data to determine how much delay time for each unit circuit is changing. The table 804 illustrates a series of ASCII hexadecimal values from which the raw data of the table 802 has been calibrated, compensated, and provided as an output to the post processing algorithm of block 624.

A useful aspect of the present techniques is that the FPGA based time measurement device can continue to collect data on the timing between pulses, while that data is also being calibrated by the lookup table and compensated by temperature and aging measurements. That is, the present techniques may be implemented in examples where no down time is needed. The operations may all operate during runtime.

FIGS. 9A-9C illustrate data from an example implementation of a TOF FPGA system. The plots are typical measurement histograms of 50000 events each. FIG. 9A shows data from START to STOP pulse pairs 20 no apart. FIG. 9B illustrates data for START to STOP pairs 650 ns apart. FIG. 9C illustrates data for an even longer 3 μs START to STOP separation. All three plots show that the mean measured values are in line with the applied pulse separation, and that the standard deviation of the measurement error is small, 133 ps or less in this example.

Figure 10A:
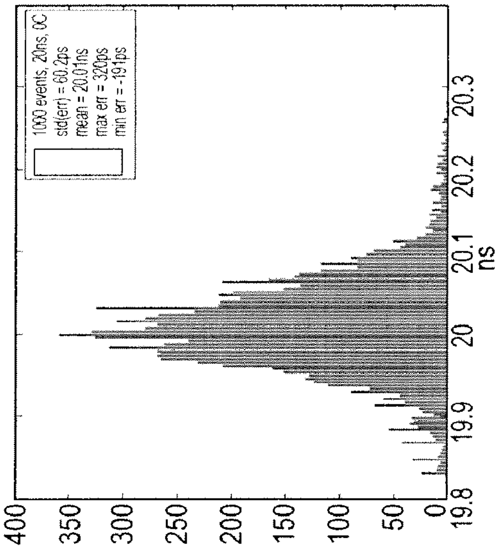
Figure 10B:
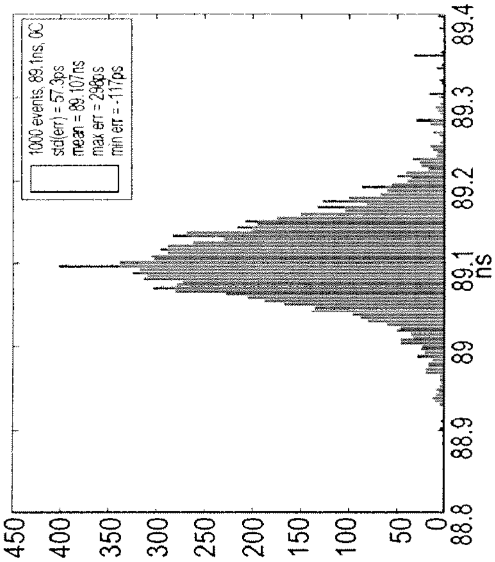
Figure 10C:
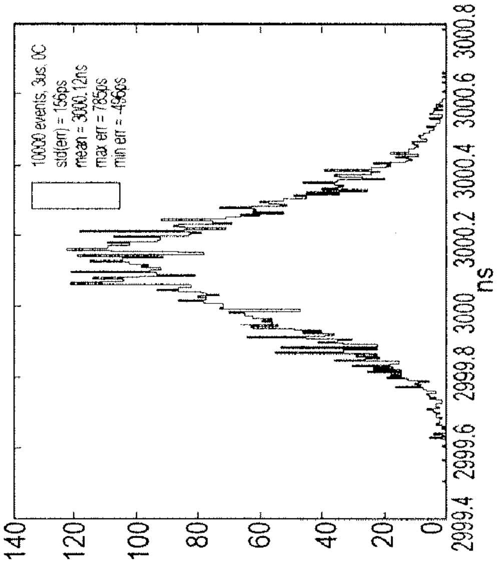
Figure 10D:
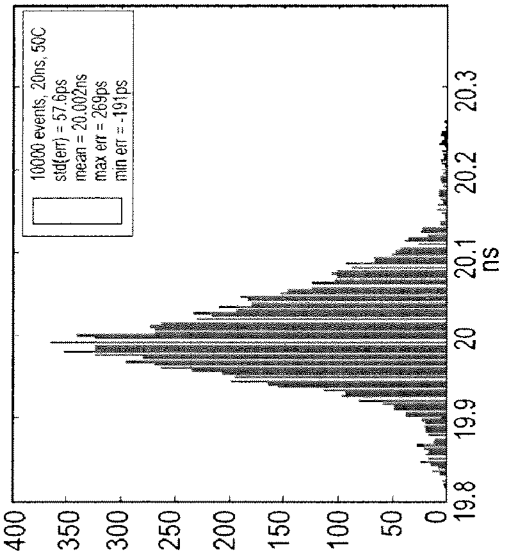
Figure 10E:
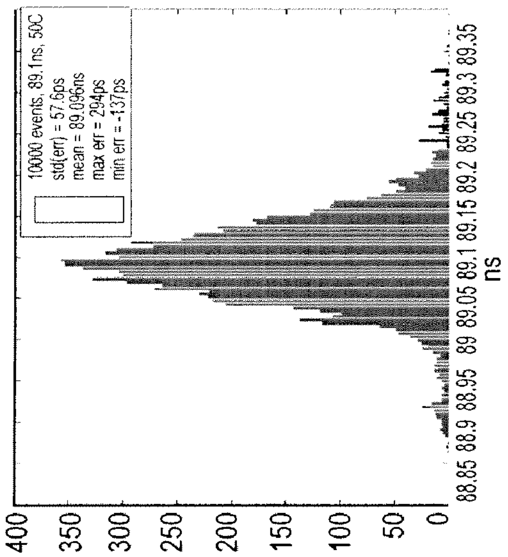
Figure 10F:
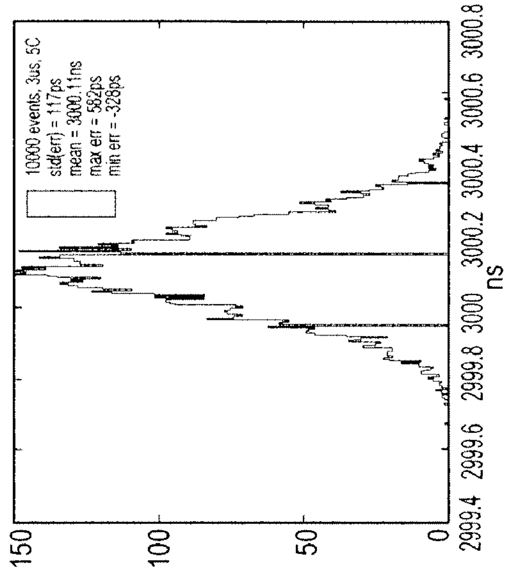

FIGS. 10A-10F show similar results over different temperatures, and they show that the FPGA implementation is relatively temperature insensitive. FIGS. 10A-100 reflect data obtained at 0 degrees C. while FIGS. 10D-10F reflect data obtained at 50 degrees C. and the peaks in each row correspond to the same measured timing delay. While FIGS. 9 and 10 show example empirical time resolution data, the data is merely representative, not limiting. Higher or lower resolution may be obtained as desired. In fact, the resolution may be adjusted by adjusting, on the FPGA level, the timing between each of the unit circuit elements.

While four delay line columns are shown, it is noted that additional delay lines may be used to collect snapshots of pulses propagating through the delay lines. The longest delay of the external pulse applied initially to column 400 can be equal to or greater than the clock cycle, as desired. In some implementations, a 20 ns delay has been used to allow two full clock cycles to pass for each pulse trigger. With consideration to overall event rates (which are often not of the nanosecond scale), scanning pulse propagation over multiple clock pulses may allow for more accurate timing measurements and more accurate measurements of the analog data collected in sample and hold circuit 108. The possibility also exists, using the described measurement technique, to present the event timing measurement as absolute time values rather than a relative difference in time between two events.

While the disclosed methods and apparatus are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

The foregoing description is given for clearness of understanding only, and no unnecessary limitations should be understood therefrom, as modifications within the scope of the invention may be apparent to those having ordinary skill in the art.

What is claimed is:

1. An apparatus comprising:

a field programmable gate array having at least one delay line to propagate an electrical signal, the at least one delay line having a plurality of unit circuits;

a memory buffer to store snapshot data captured from the at least one delay line; and a processor adapted to analyze the snapshot data from the memory buffer to determine calibration data for the at least one delay line, the calibration data representing a measured delay for each of the unit circuits in the least one delay line.

2. The apparatus of claim 1, wherein a collective time delay for the at least one delay line is longer than an operating clock cycle for the field programmable gate array.

3. The apparatus of claim 2, wherein the collective time delay is between one and two operating clock cycles and wherein the calibration data is obtained by capturing snapshot data at least twice over the collective time delay.

4. The apparatus of claim 2, wherein the at least one delay line comprises a plurality of delay lines each characterized by a pulse propagation time that is less than the operating clock cycle.

5. The apparatus of claim 1, wherein the memory buffer comprises at least one latch and first in first out (FIFO) buffer pair.

6. The apparatus of claim 5, wherein the memory buffer comprises a separate latch and FIFO buffer pair for each of the at least one delay line.

7. The apparatus of claim 6, further comprising an edge detection circuit coupled to each of the separate latch and FIFO buffer pairs to detect edge transitions in data stored by the latch and FIFO buffer pairs.

8. The apparatus of claim 7, wherein the edge detection circuit is coupled to a prioritizing circuit that analyzes detected edge transitions from the edge detection circuit to identify edge transitions on a START pulse of the electrical signal.

9. The apparatus of claim 1, wherein the unit circuits each comprise a plurality of flip flops, and wherein the at least one delay line comprises a plurality of delay lines each consisting of a column of unit circuits of the field programmable gate array operatively coupled together, and at least one of the plurality of delay lines being capable of coupling an electrical pulse into another of the delay lines.

10. The apparatus of claim 9, wherein each column of the unit circuits includes no more than 40 rows of unit circuits, each unit circuit comprising four flip flops, and wherein there are four or few columns of unit circuits.

11. The apparatus of claim 1, wherein the processor is to develop a lookup table including the calibration data representing the measured delay for each of the unit circuits.

12. The apparatus of claim 11, wherein the field programmable gate array is capable of calibrating during runtime raw pulse data measured by the field programmable gate array using the calibration data.

13. The apparatus of claim 12, wherein the field programmable gate array is capable of compensating for delay line drift during runtime by tracking the propagation of a pulse edge along the at least one delay line and compensating the raw pulse data based on that tracking.

14. The apparatus of claim 1, wherein the at least one delay line comprises a plurality of delay registers, each register having a timing delay below 1 ns.

15. The apparatus of claim 1, wherein the at least one delay line comprises a plurality of delay registers, and wherein the processor is adapted to determine a state of each of the plurality of delay registers to determine the calibration data.

16. The apparatus of claim 1, wherein the field programmable gate array is capable of measuring a time difference between a START pulse and a plurality of STOP pulses occurring before a subsequent START pulse.

17. The apparatus of claim 16, wherein the field programmable gate array is capable of measuring a relative time difference between the START pulse and each of the plurality of STOP pulses.

18. The apparatus of claim 17, wherein the field programmable gate array is capable of measuring an absolute time for the START pulse and each of the plurality of STOP pulses.

19. An apparatus for measuring time between a start event and at least one stop event, the apparatus comprising a field programmable gate array assembly having a plurality of configurable logic blocks to propagate an electrical signal triggered in the field programmable gate array assembly in response to the start event, wherein the field programmable gate array assembly is configured to capture snapshot data from the plurality of configurable logic blocks every clock cycle event to identify progression of the electrical signal through the plurality of configurable logic blocks until the at least one stop event is detected.

20. The apparatus of claim 19, wherein the field programmable gate array assembly is configured to capture the snapshot data every clock cycle event to identify progression of the electrical signal until each of a plurality of the stop events is detected.

21. The apparatus of claim 20, wherein the plurality of configurable logic blocks are configured into a plurality of columns each formed of a plurality of rows of configurable logic blocks, such that the field programmable gate array assembly is configured to capture snapshot data for every one of the plurality of columns each clock cycle event.

22. The apparatus of claim 21, wherein each of the plurality of columns is characterized by a propagation time that is less than a period of the clock cycle event.

23. The apparatus of claim 19, further comprising:

(a) a memory buffer to store the snapshot data every clock cycle event; and (b) a electrical signal edge detector coupled to the memory buffer to detect edge transitions of the electrical signal as the electrical signal progresses through the plurality of configurable logic blocks.

24. The apparatus of claim 23, further comprising a processor to analyze data from the electrical signal edge detector to determine the time between the start event and the at least one stop event.

25. The apparatus of claim 24, wherein the processor is to calibrate the data from the electrical signal edge detector based on measured delay times for the plurality of configurable logic blocks.

26. The apparatus of claim 24, wherein the processor is to compensate for delay time drift in the plurality of configurable logic blocks.

27. The apparatus of claim 24, wherein the processor is to compensate for temperature drift of the plurality of configurable logic blocks.

* * * * *